US012206218B2

(12) United States Patent
Noguchi et al.

(10) Patent No.: US 12,206,218 B2
(45) Date of Patent: Jan. 21, 2025

(54) OPTICAL MODULE

(71) Applicant: CIG Photonics Japan Limited, Kanagawa (JP)

(72) Inventors: Daisuke Noguchi, Tachikawa (JP); Takayuki Nakao, Yokohama (JP)

(73) Assignee: CIG PHOTONICS JAPAN LIMITED, Kanagawa (JP)

( * ) Notice: Subject to any disclaimer, the term of this patent is extended or adjusted under 35 U.S.C. 154(b) by 693 days.

(21) Appl. No.: 17/507,123

(22) Filed: Oct. 21, 2021

(65) Prior Publication Data

US 2022/0173571 A1   Jun. 2, 2022

(30) Foreign Application Priority Data

Dec. 2, 2020   (JP) .................................. 2020-200298

(51) Int. Cl.
| | |
|---|---|
| *H01S 5/02345* | (2021.01) |
| *H01S 5/0231* | (2021.01) |
| *H01S 5/02315* | (2021.01) |
| *H01S 5/024* | (2006.01) |

(52) U.S. Cl.
CPC ........ *H01S 5/02345* (2021.01); *H01S 5/0231* (2021.01); *H01S 5/02315* (2021.01); *H01S 5/02415* (2013.01)

(58) Field of Classification Search
CPC ............... H01S 5/0231; H01S 5/02345; H01S 5/02315; H01S 5/02415; H01S 5/02212; H01L 31/0203; H01L 31/02005; H01L 31/024

See application file for complete search history.

(56) References Cited

U.S. PATENT DOCUMENTS

| | | | |
|---|---|---|---|
| 11,431,146 B2 * | 8/2022 | Victoria | .............. H01S 5/02345 |
| 2012/0045161 A1 | 2/2012 | Okada | |
| 2015/0116809 A1 | 4/2015 | Uto et al. | |
| 2015/0318664 A1 * | 11/2015 | Eckert | ................... H01S 5/0237 |
| | | | 29/841 |

FOREIGN PATENT DOCUMENTS

| | | |
|---|---|---|
| JP | 2011108939 A | 6/2011 |
| JP | 2015-088641 A | 5/2015 |

OTHER PUBLICATIONS

Japanese Office Action received in corresponding Japanese Application No. 2020-200298 dated May 28, 2024.

* cited by examiner

*Primary Examiner* — Xinning(Tom) Niu
*Assistant Examiner* — Delma R Forde
(74) *Attorney, Agent, or Firm* — MATTINGLY & MALUR, PC

(57) ABSTRACT

The metallization pattern includes a pair of first metal films on the respective pair of first surfaces, and a second metal film on the pair of second surfaces to connect the pair of first metal films. The support block includes a connection conductor connecting the pair of first metal films, the connection conductor being a castellation conductor and/or a via conductor, the castellation conductor being on the pair of third surfaces of the ceramic body, the via conductor being through the ceramic body between the pair of first surfaces. The mounting substrate is mounted on one of the pair of first surfaces. One end of the first wire is bonded to a corresponding one of the pair of first metal films or the connection conductor, at a position adjacent to or overlapping with the connection conductor, on another of the pair of first surfaces.

12 Claims, 11 Drawing Sheets

OPTICAL MODULE

CROSS-REFERENCE TO RELATED APPLICATION

The present application claims priority from Japanese patent application JP2020-200298 filed on Dec. 2, 2020, the contents of which are hereby incorporated by reference into this application.

BACKGROUND

1. Field

This disclosure relates to an optical module.

2. Description of the Related Art

Small optical modules are required to have heat dissipation and high-frequency characteristics improved. A transistor outline can (TO-CAN) package (JP 2011-108939A) is configured to transmit electrical signals to a semiconductor optical device using lead pins penetrating an eyelet. A substrate with the semiconductor optical device mounted thereon is mounted on a support block.

The support block made of the same material as the eyelet is not good in thermal conductivity. Or, the support block may be formed from a material with an excellent thermal conductivity, such as aluminum nitride, but it is difficult in processing to form a metal film on the entire surface thereof. Alternatively, a structure in which the metal film is formed only on part of the support block is inferior in the high-frequency characteristics.

SUMMARY

This disclosure aims at improving heat dissipation and high-frequency characteristics.

(1) An optical module includes: a stem from which a pedestal portion integrally protrudes; a photoelectric device configured to convert an optical signal and an electrical signal from at least one to another; a mounting substrate on which the photoelectric device is mounted; a support block with a ceramic body, the support block having a metallization pattern on a surface of the ceramic body, the mounting substrate overlapping with the metallization pattern and being mounted on the support block; and a first wire electrically connecting the pedestal portion and the metallization pattern, the surface of the ceramic body including a pair of first surfaces facing in opposite directions along a first direction, the surface of the ceramic body including a pair of second surfaces facing in opposite directions along a second direction intersecting with the first direction, the surface of the ceramic body including a pair of third surfaces facing in opposite directions along a third direction intersecting with both the first direction and the second direction, the metallization pattern including a pair of first metal films on the respective pair of first surfaces, the metallization pattern including a second metal film on at least one of the pair of second surfaces to connect the pair of first metal films, the support block including a connection conductor connecting the pair of first metal films, the connection conductor being at least one of a castellation conductor and a via conductor, the castellation conductor being on at least one of the pair of third surfaces of the ceramic body, the via conductor being through the ceramic body between the pair of first surfaces, the mounting substrate being mounted on one of the pair of first surfaces, one end of the first wire being bonded to a corresponding one of the pair of first metal films or the connection conductor, at a position adjacent to or overlapping with the connection conductor, on another of the pair of first surfaces.

Heat dissipation can be improved by the ceramic body, and high-frequency characteristics can be improved by electrical continuity of the pair of first metal film through the connection conductor.

(2) In the optical module according to (1), the position at which the one end of the first wire may be bonded is at an edge of a corresponding one of the pair of first surfaces, the edge being adjacent to one of the pair of third surfaces.

(3) In the optical module according to (2), the support block may have the via conductor, and the via conductor may be at the edge of the corresponding one of the pair of first surfaces.

(4) In the optical module according to (3), the one end of the first wire may be positioned outer than the via conductor along the third direction.

(5) In the optical module according to (3) or (4), the pair of first metal films ma overlap with the via conductor.

(6) In the optical module according to any one of (3) to (5), the via conductor may include some via conductors, at least one of the via conductors may be at the edge of the corresponding one of the pair of first faces, and at least another one of the via conductors may be at another edge opposite to the edge along the third direction.

(7) In the optical module according to any one of (1) to (6), the pair of first surfaces and the pair of second surfaces may be entirely covered with the metallization pattern, and the pair of third surfaces may include a region not covered with the metallization pattern.

(8) In the optical module according to any one of (1) to (7), the one end of the first wire may overlap with the connection conductor.

(9) In the optical module according to any one of (1) to (7), the first wire may include some first wires, at least one of the first wires may be bonded to and overlaps with the connection conductor, and at least another one of the first wires may be bonded to the connection conductor without overlap.

(10) In the optical module according to any one of (1) to (7), the first wire may include some first wires, and all of the first wires may be bonded to the connection conductor without overlap.

(11) In the optical module according to any one of (1) to (10), the support block may be disposed to have one of the pair of third surfaces opposed to the pedestal portion.

(12) The optical module according to any one of (1) to (11), may further include: a thermoelectric cooler containing a Peltier device; and a second wire electrically connecting the pedestal portion and the metallization pattern, the second metal film including a pair of second metal films formed on both of the pair of second surfaces, the thermoelectric cooler being fixed to one of the pair of second metal films, one end of the second wire being bonded to another of the pair of second metal films.

DETAILED DESCRIPTION

Figure 1:
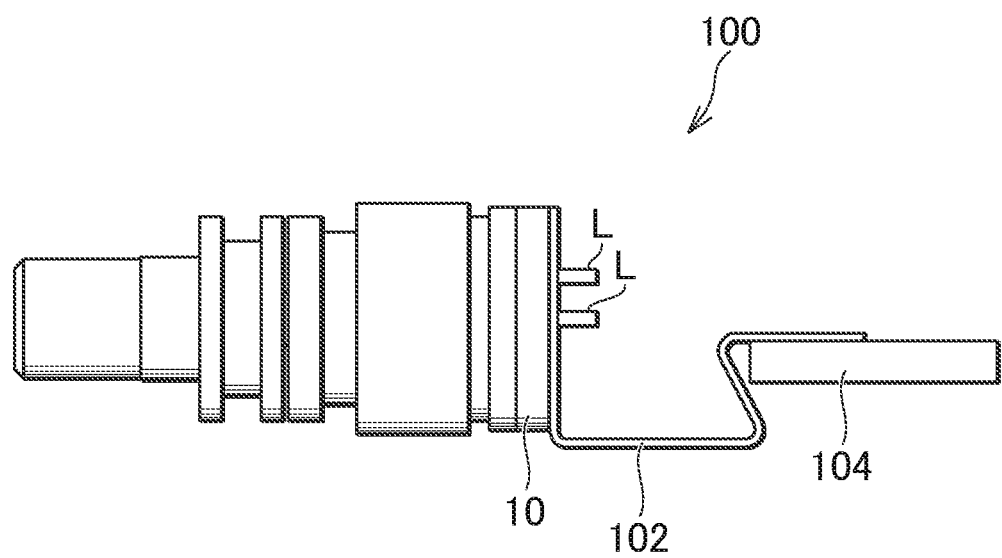
FIG. 1 is a perspective view of an optical module according to a first embodiment.

Hereinafter, some embodiments will be described specifically and in detail with reference to drawings. In all the drawings, the members with the same reference numerals have the identical or same feature and their repetitive description will be omitted. Sizes of figures do not always comply with magnification.

First Embodiment

FIG. 1 is a perspective view of an optical module according to a first embodiment. The optical module 100 is a transistor outline can (TO-CAN) type optical module, and may be any one of a transmitter optical sub-assembly (TOSA) with a light emitting device, a receiver optical sub-assembly (ROSA) with a light receiving device, and a bidirectional optical sub-assembly (BOSA) with both a light emitting device and a light receiving device. The optical module 100 has a flexible printed circuit board (FPC) 102 adapted to be connected to a printed circuit board (PCB) 104. The optical module 100 has a stem 10.

Figure 2:
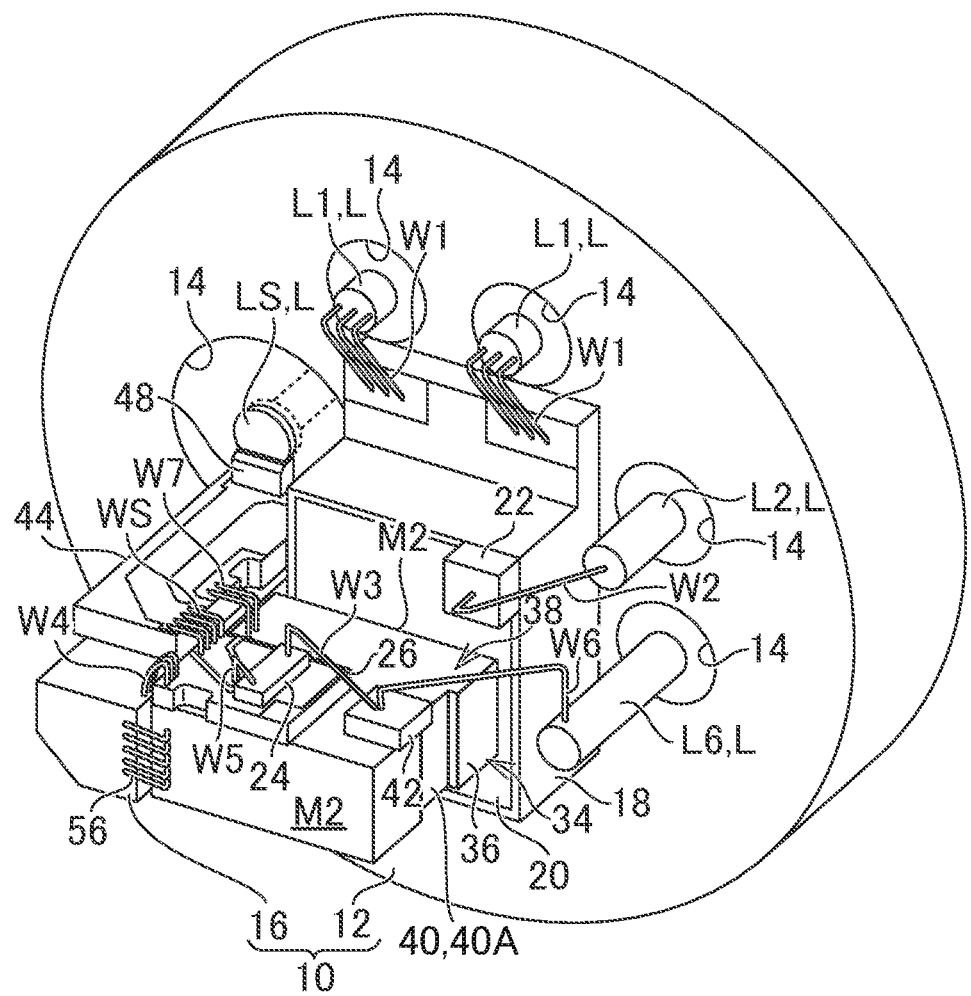
FIG. 2 is a perspective view of a stem and an electronic component mounted on it.
Figure 3:
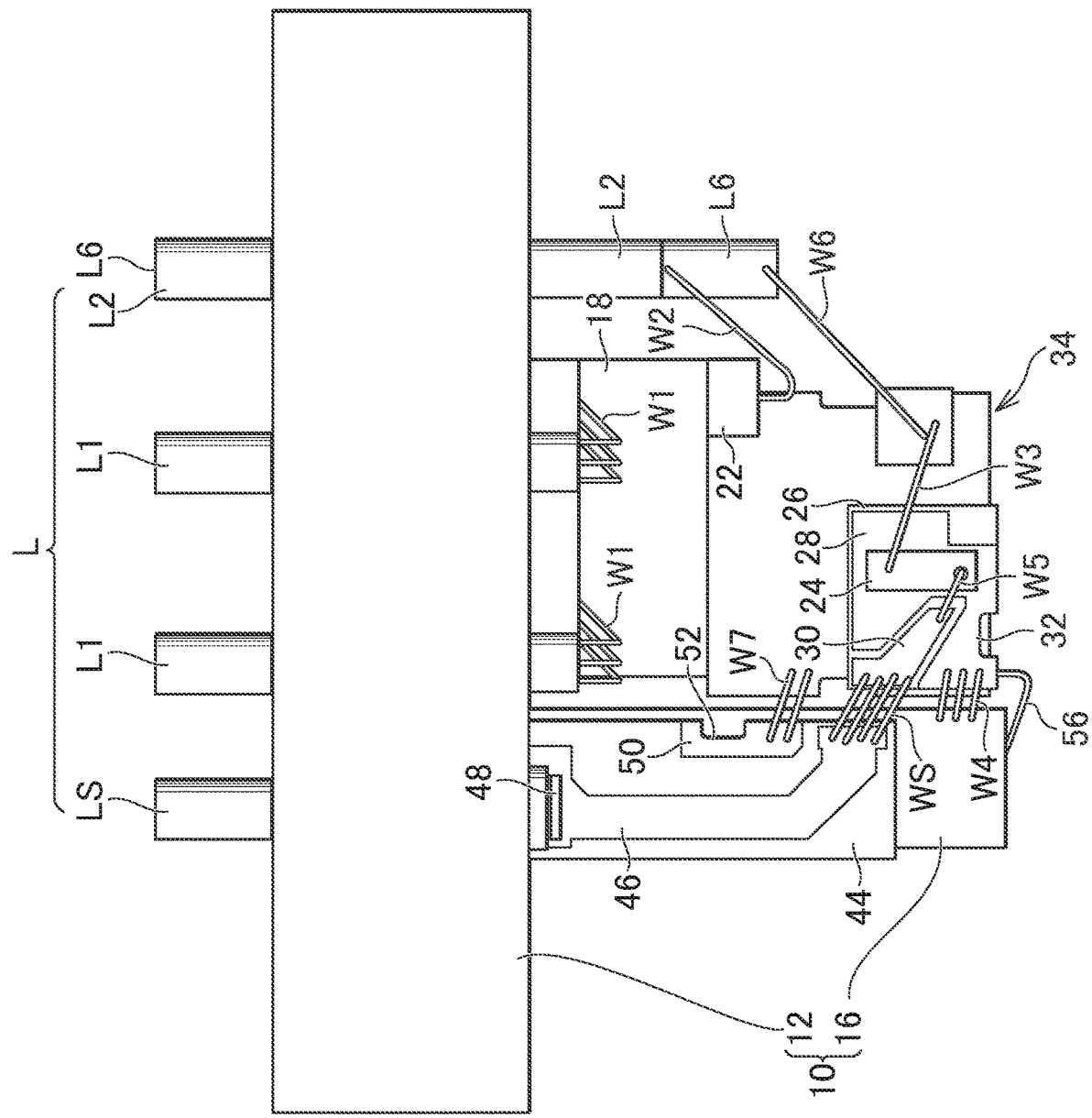
FIG. 3 is a plan view of the stem and the electronic component mounted on it.
Figure 4:
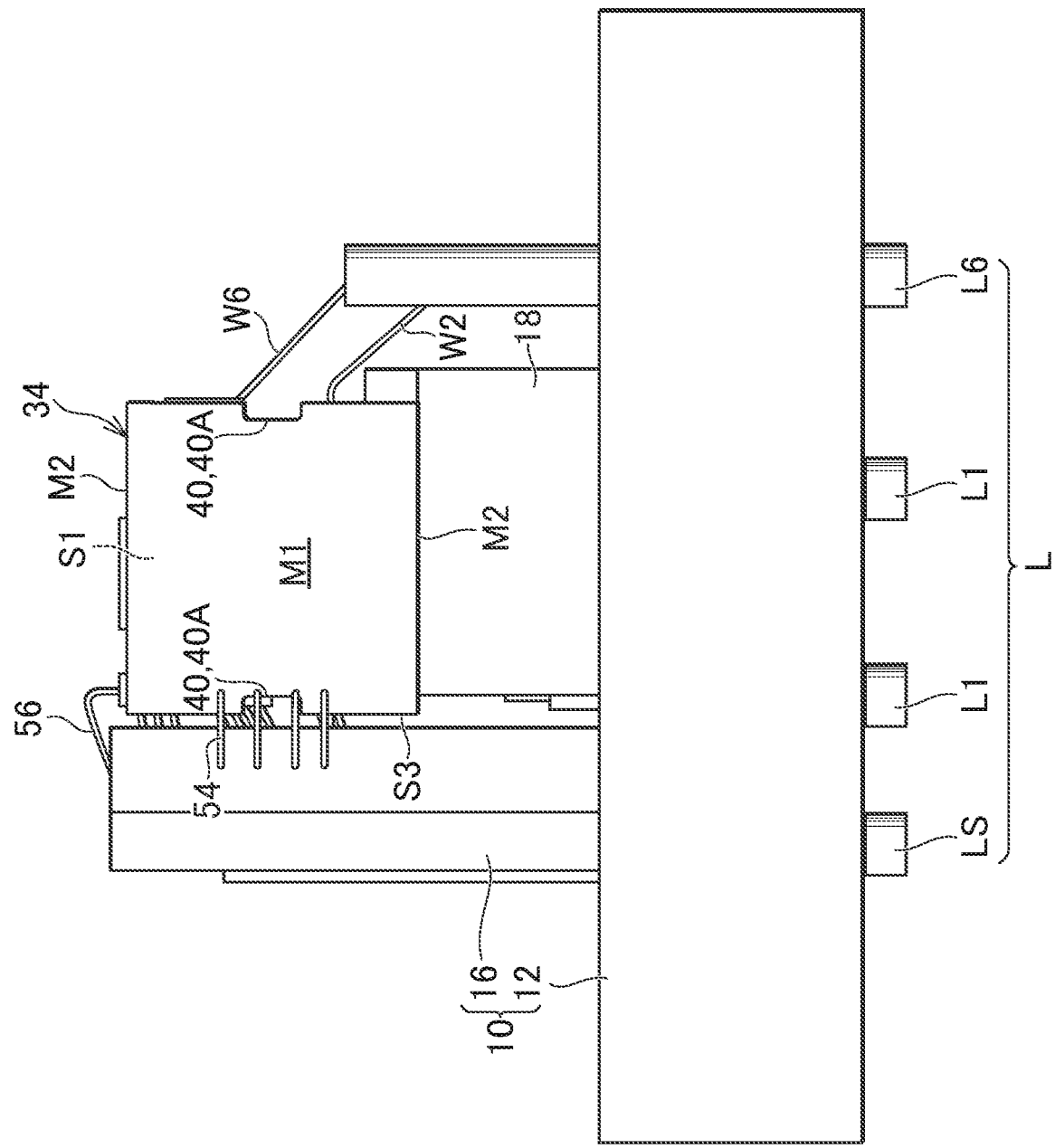
FIG. 4 is a bottom view of the stem and the electronic component mounted on it.

FIG. 2 is a perspective view of a stem 10 and an electronic component mounted on it. FIG. 3 is a plan view of the stem 10 and the electronic component mounted on it. FIG. 4 is a bottom view of the stem 10 and the electronic component mounted on it.

The stem 10 is made of a conductive material such as a metal. The stem 10 includes an eyelet 12. The eyelet 12 has some through holes 14 penetrating it between its front and back surfaces in a thickness direction. The stem 10 has a pedestal portion 16 integral with the eyelet 12. The pedestal portion 16 is also made of a conductor. The stem 10 is connected to a reference potential (e.g., ground). The optical module 100 has some lead pins L. The lead pins L are fixed inside the through holes 14 but are insulated from the stem 10 with an insulator such as glass. The lead pins L are connected to the flexible printed circuit board 102 (FIG. 1).

The optical module 100 has a thermoelectric cooler 18. The thermoelectric cooler 18 has an upper surface and a lower surface. The upper surface and the lower surface are made of an insulator such as ceramic. The lower surface is fixed to the stem 10 (eyelet 12). A thermally conductive adhesive may be used for fixing. The thermoelectric cooler contains a Peltier device (not shown) configured to transfer heat between the upper surface and the lower surface. For example, the upper surface may serve as a heat absorbing surface and the lower surface may serve as a heat radiating surface, or vice versa by switching. The thermoelectric cooler 18 has an electrode connected to the lead pin L1 with a wire W1.

A metal layer 20 is laminated on the upper surface of the thermoelectric cooler 18. The metal layer 20 serves as a reference potential plane (e.g., ground plane). A thermistor 22 is on and electrically connected to the metal layer 20, whereby temperature can be measured. The thermistor 22 is connected to a lead pin L2 with a wire W2 to apply a voltage.

The optical module 100 has a photoelectric device 24 configured to convert an optical signal and an electrical signal at least from one to another. The photoelectric device 24 has a semiconductor laser and an optical modulator integrated therein. A wire W3 is bonded to the semiconductor laser to apply a DC voltage. The optical modulator is configured to be driven single-ended. The photoelectric device 24 is mounted on the mounting substrate 26.

The mounting substrate 26 has a mounting surface on which the photoelectric device 24 is mounted. The photoelectric device 24 is disposed to have its optical axis directed in a direction parallel to the mounting surface. The upper surface of the thermoelectric cooler 18 and the mounting surface face in directions intersecting with (e.g., perpendicular to) each other. The mounting substrate 26 has a first ground pattern 28 and a first signal pattern 30 on the mounting surface.

The photoelectric device 24 has a back surface (electrode) bonded to the first ground pattern 28. The first ground pattern 28 is integrated with the first side electrode 32, enabling electrical connection on a side opposite to the mounting surface. The first ground pattern 28 is connected to the pedestal portion 16 with a wire W4. The first signal pattern 30 is electrically connected to the photoelectric device 24 (optical modulator) with a wire W5 to input high-frequency signals. Incidentally, an unillustrated termination resistor may be provided on the mounting substrate 26 to prevent reflected waves of the modulated electric signals with a high-frequency component from returning to a drive IC (not shown). The mounting substrate 26 is mounted on the support block 34.

Figure 5:
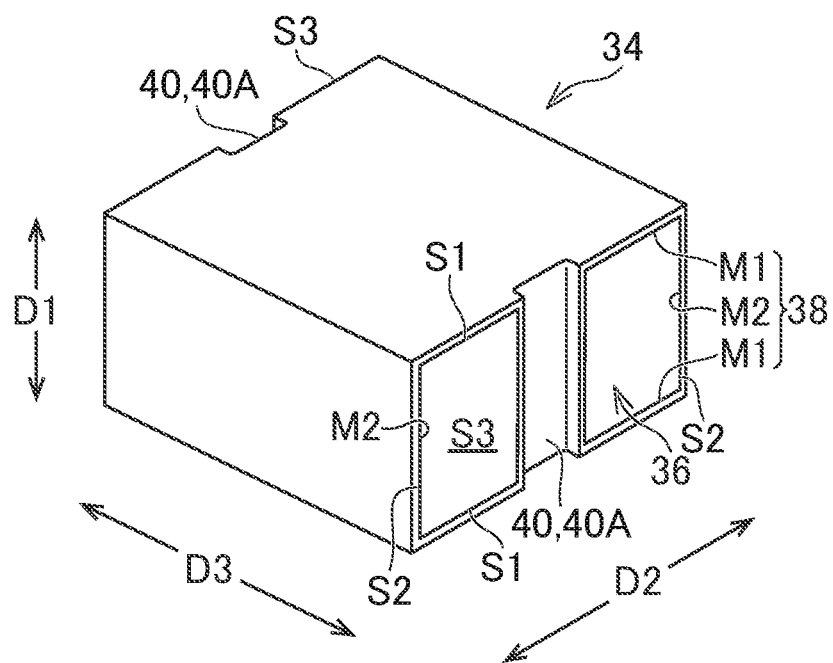
FIG. 5 is a perspective view of a support block according to the first embodiment.

FIG. 5 is a perspective view of a support block 34 according to the first embodiment. The support block 34 shown in FIG. 2 has a ceramic body 36. The ceramic body 36 is made of a material with excellent thermal conductivity, such as aluminum nitride, therefore improving heat dissipation. The ceramic body 36 has a surface including a pair of first surfaces S1 facing opposite directions along a first direction D1. The mounting substrate 26 is mounted on one of the pair of first surfaces S1. The surface of the ceramic body 36 includes a pair of second surfaces S2 facing opposite directions along a second direction D2 intersecting with (e.g., perpendicular to) the first direction D1. The surface of the ceramic body 36 includes a pair of third surfaces S3 facing opposite directions along a third direction D3 intersecting with (e.g., perpendicular to) both the first direction D1 and the second direction D2. The support block 34 shown in FIG. 2 is disposed to have one of the pair of third surface S3 opposed to the pedestal portion 16.

The support block 34 has a metallization pattern 38 on the surface of the ceramic body 36. The mounting substrate 26 is mounted on and overlaps with the metallization pattern 38. The metallization pattern 38 includes a pair of first metal films M1 on the respective pair of first surfaces S1. The metallization pattern 38 includes a second metal film M2 on at least one (e.g., each of both) of the pair of second surfaces S2 to connect the pair of first metal films M1. The pair of first surfaces S1 and the pair of second surfaces S2 are entirely covered with the metallization pattern 38. The pair of third surfaces S3 include a region not covered with the metallization pattern 38.

The support block 34 includes a connection conductor that connects the pair of first metal films M1. The connection conductor 40 is at least one (e.g., castellation conductor 40A) of a castellation conductor 40A and a via conductor. The castellation conductor 40A is on at least one of the pair of third surfaces S3 of the ceramic body 36. For example, the third surface S3 has a recess along the first direction D1, and a metal film is formed in the recess. The recess is located at a center of the third surface S3 along the second direction D2. The castellation conductors 40A may be integrated with the pair of first metallic films M1.

As shown in FIG. 2, a bypass capacitor 42 is mounted on the support block 34. The bypass capacitor 42 has a back surface (one electrode) electrically continuous to the support block 34 (metallized pattern 38) and connected to the reference potential (e.g., ground). The bypass capacitor 42 has another electrode connected to the lead pin L6 with a wire W6 to apply a voltage. The voltage is also connected to the photoelectric device 24 (semiconductor laser) with the wire W3 to supply a DC voltage. The bypass capacitor 42 is configured to separate the high-frequency signals superimposed on DC signals.

As shown in FIG. 3, a relay board 44 is mounted on the pedestal portion 16 of the stem 10. The relay board 44 has a second signal pattern 46. The second signal pattern 46 is electrically connected to the lead pin LS. Specifically, there is a filler metal 48 (solder, brazing material) between an end of the lead pin LS and a terminal of the second signal pattern 46, whereby both of them are electrically connected. The second signal pattern 46 is connected to the first signal pattern 30 with a signal wire WS. The relay board 44 has a second ground pattern 50. The second ground pattern 50 is integrated with a second side electrode 52, enabling electrical connection on a rear surface and electrical connection to the pedestal portion 16. The second ground pattern 50 is connected to the support block 34 with a wire W7.

As shown in FIG. 4, the optical module 100 has a first wire 54. The first wire 54 electrically connects the pedestal portion 16 and the metallization pattern 38 (first metal film M1). One end of the first wire 54 is bonded to one (opposite to the photoelectric device 24) of the pair of first surfaces S1. A position where the one end of the first wire 54 is bonded is at an edge, of a corresponding one of the pair of first surfaces S1, adjacent to one of the pair of third surfaces S3.

The one end of the first wire 54 is bonded to a corresponding one of the pair of first metal films M1 or the connection conductor 40. The one end of the first wire 54 is bonded is at a position that is adjacent to or overlaps with the connection conductor 40. The one end of the first wire 54 overlaps with the connection conductor 40. At least one of first wires 54 is bonded to and overlaps with the connection conductor 40. At least another one of the first wires 54 is bonded to the connection conductor 40 without overlap.

As shown in FIG. 2, the pedestal portion 16 and the metallization pattern 38 are electrically connected with a second wire 56. One end of the second wire 56 is bonded to one of the pair of second metal films M2. The thermoelectric cooler 18 is fixed to another of the pair of second metal films M2.

The reference potential (ground potential) is supplied from the stem 10 to the metallization pattern 38 of the support block 34 through the first wire 54 and the second wire 56. Furthermore, the connection conductor 40 makes the pair of first metal films M1 electrically continuous. Thus, the ground potential is supplied directly below the mounting substrate 26.

Figure 6:
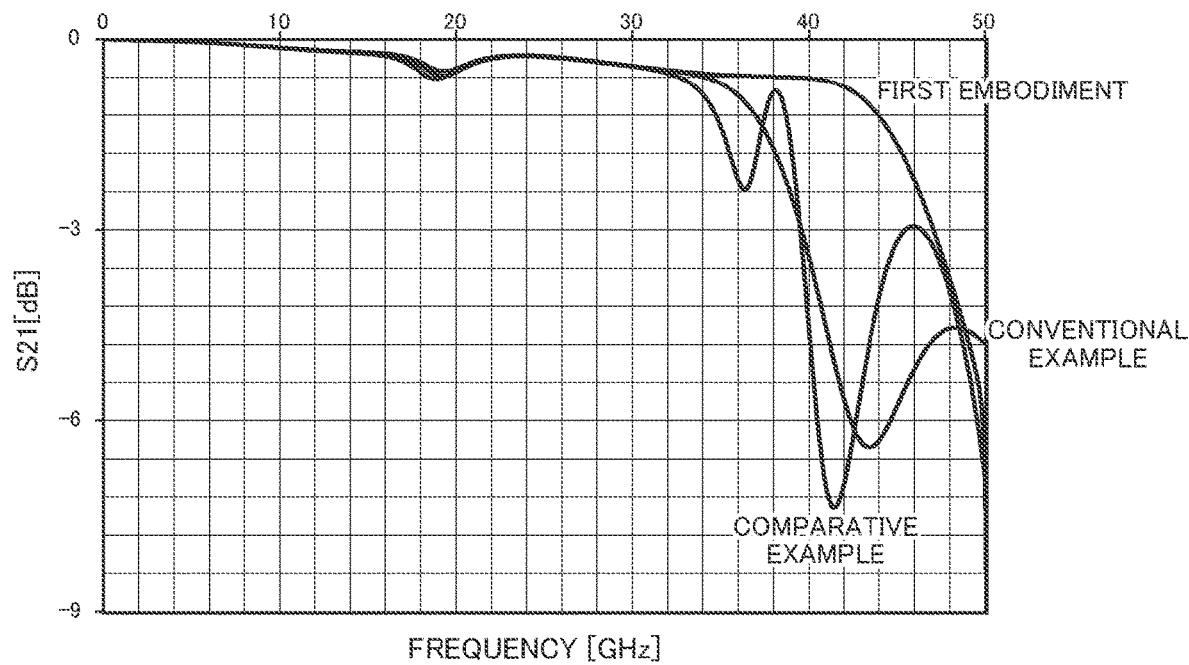
FIG. 6 is a diagram of frequency characteristics, in a conventional example, a comparative example, and the first embodiment, obtained by simulation using a three-dimensional electric field analysis tool.

FIG. 6 is a diagram of frequency characteristics, in a conventional example, a comparative example, and the first embodiment, obtained by simulation using a three-dimensional electric field analysis tool. The conventional example employed a support block entirely made of metal without a first wire. The comparative example employed a support block with a metal film formed only on upper and front surfaces of a ceramic body, without a connection conductor, without a first wire. Therefore, in the comparative example, the ground potential was supplied just below the mounting substrate through the metallized pattern, but the transmission characteristics at frequencies above 30 GHz deteriorated more than in the conventional example.

In the first embodiment, the ground potential is supplied just below the mounting substrate 26, through the metallization pattern 38 (a pair of first metal films M1) via the castellation conductor 40A (connection conductor 40). This can stabilize the ground potential and improve the high-frequency characteristics, enabling transmission at more than 40 GHz.

Figure 7A:
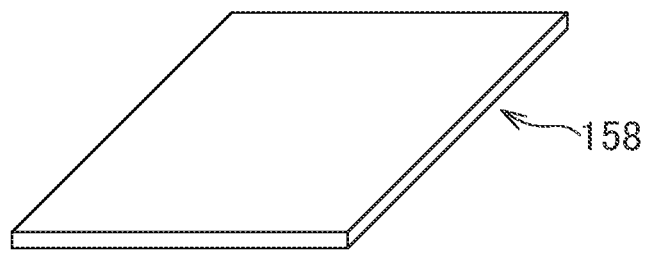
FIG. 7A is a diagram of a method of manufacturing the support block.
Figure 7B:
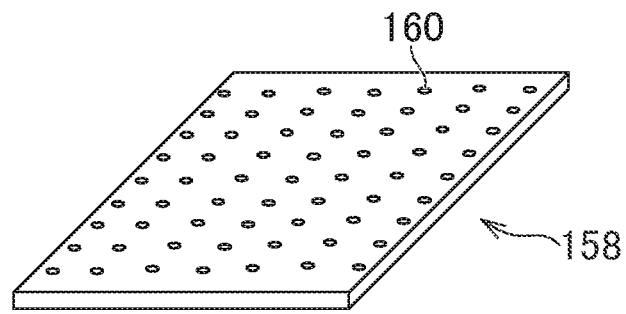
FIG. 7B is a diagram of the method of manufacturing the support block.
Figure 7C:
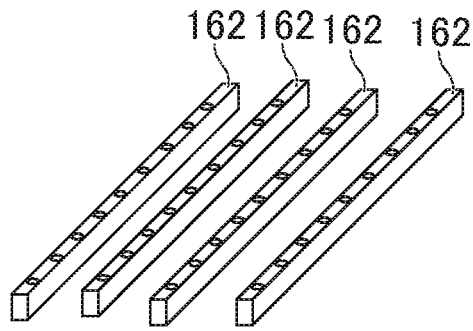
FIG. 7C is a diagram of the method of manufacturing the support block.

FIGS. 7A to 7D are diagrams of a method of manufacturing the support block. In FIG. 7A, a ceramic substrate 158 made of aluminum nitride is shown. As shown in FIG. 7B, some through holes 160 are formed in the ceramic substrate 158. Aluminum nitride is excellent also in processability and is more suitable for compact processing than metal. Subsequently, as shown in FIG. 7C, the ceramic board 158 is cut into some ceramic bars 162. Cutting is performed at a position except the through holes 160.

Deposition with metal such as gold is performed possibly by sputtering on each of the ceramic bars 162. Deposition is performed also on an inner surface of the through hole 160. Such deposition by sputtering, compared with deposition by gold plating on the metal body, can stably control a thickness of a gold layer, leading to reduction in defects during wire bonding.

Figure 7D:
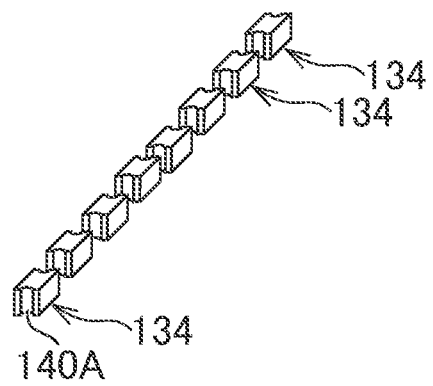
FIG. 7D is a diagram of the method of manufacturing the support block.

As shown in FIG. 7D, the ceramic bars 162 are cut into some support blocks 134 at lines passing through all the through-holes 160. The film on the inner surface of the through-hole 160 becomes a castellation conductive 140A.

Second Embodiment

Figure 8:
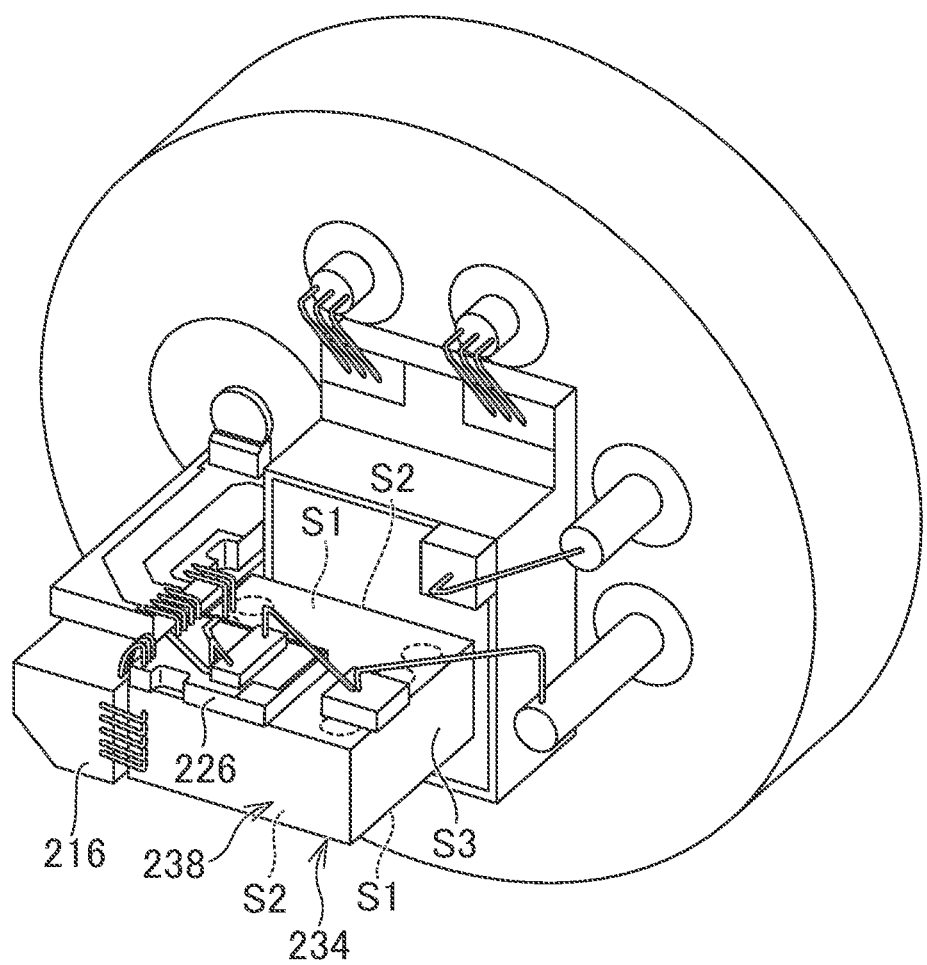
FIG. 8 is a perspective view of a stem and an electronic component mounted on it according to a second embodiment.
Figure 9:
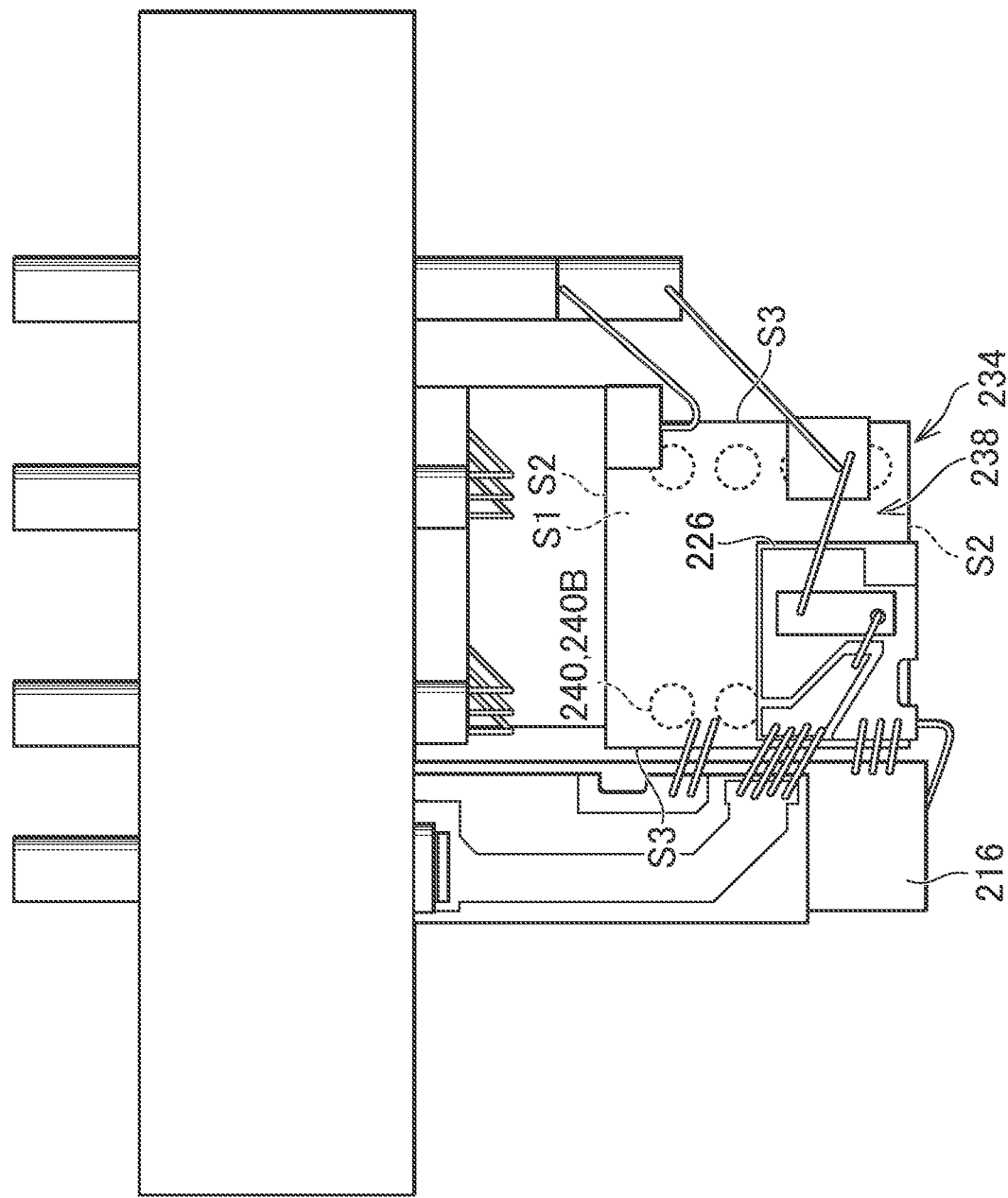
FIG. 9 is a plan view of the stem and the electronic component mounted on it shown in FIG. 8.
Figure 10:
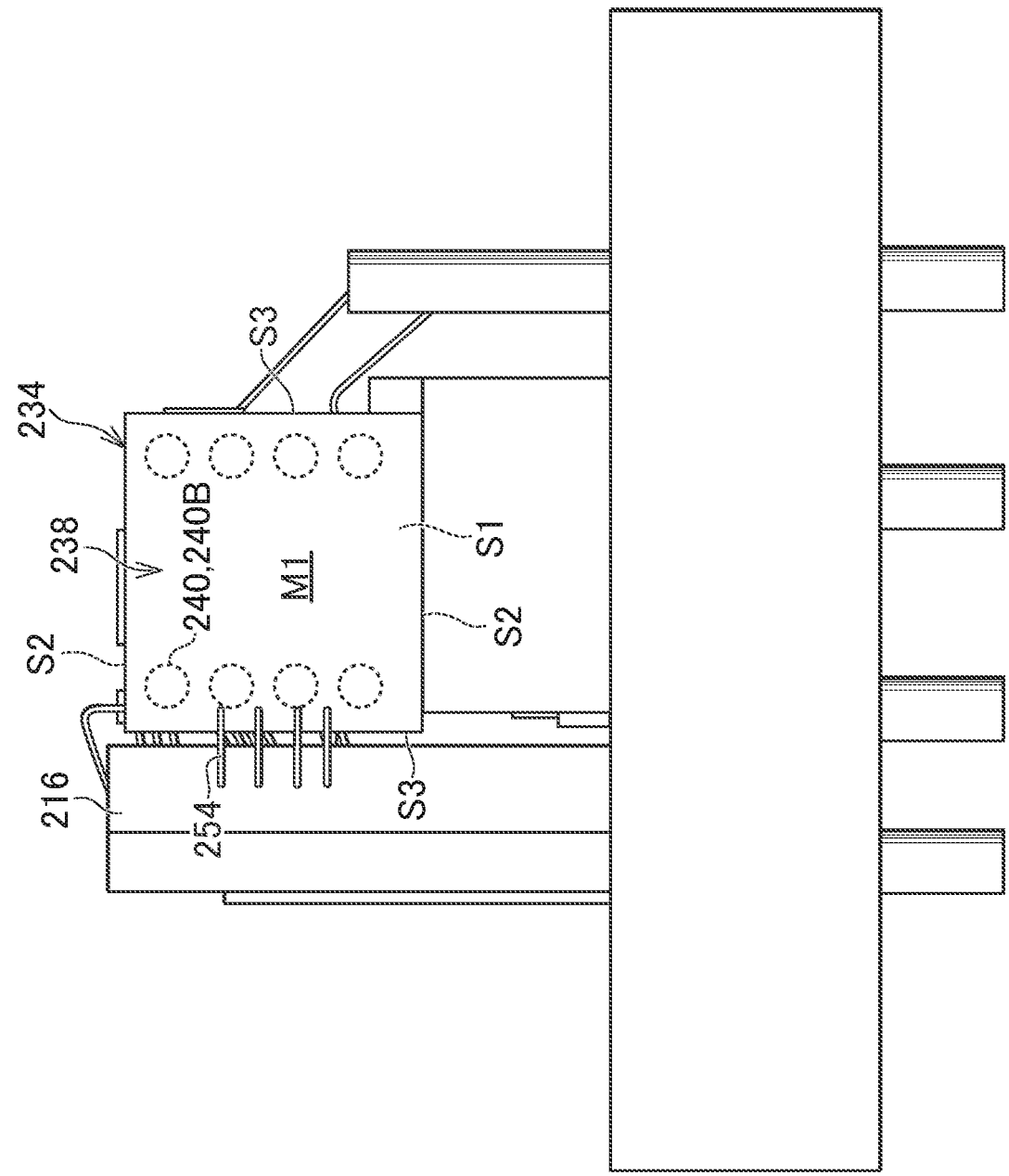
FIG. 10 is a bottom view of the stem and the electronic component mounted on it shown in FIG. 8.

FIG. 8 is a perspective view of a stem and an electronic component mounted on it according to a second embodiment. FIG. 9 is a plan view of the stem and the electronic component mounted on it shown in FIG. 8. FIG. 10 is a bottom view of the stem and the electronic component mounted on it shown in FIG. 8.

The support block 234 is disposed to have one of the pair of third surfaces S3 opposed to the pedestal portion 216. The pair of first surfaces S1 and the pair of second surfaces S2 are entirely covered with the metallization pattern 238. The mounting substrate 226 is mounted on one of the pair of first surfaces S1. The pair of third surfaces S3 include a region not covered with the metallization pattern 238.

Figure 11:
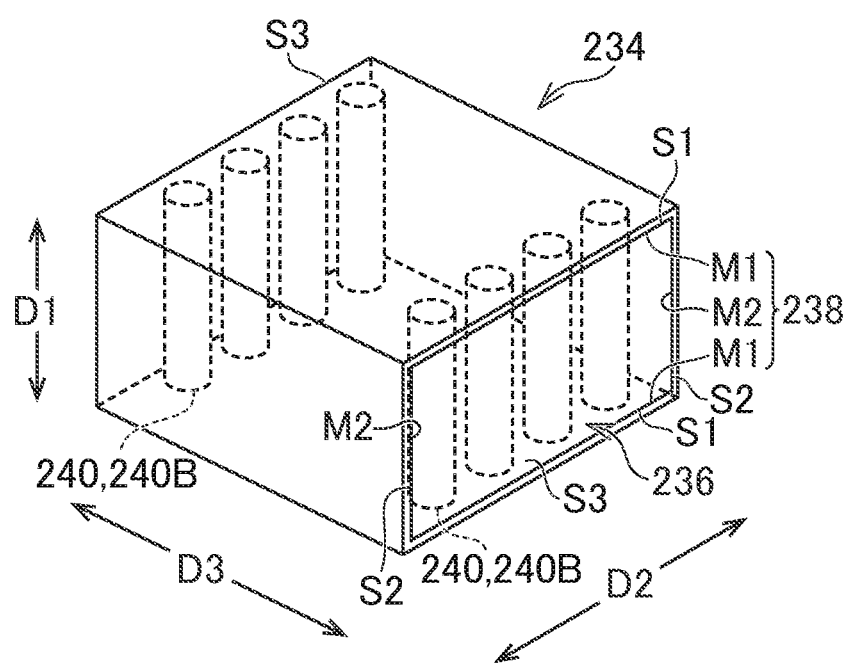
FIG. 11 is a perspective view of a support block according to the second embodiment.

FIG. 11 is a perspective view of a support block 234 according to the second embodiment. The support block 234 includes the connection conductor 240 that connects the pair of first metal films M1. The connection conductor 240 is a via conductor 240B through the ceramic body 236 between the pair of first surfaces S1. The via conductor 240B is made of a metallic material such as tungsten. Some via conductors 240B overlap with (or are covered with) the pair of first metallic films M1.

The via conductor 240B is located at an edge (at least one of both edges in the third direction) of a corresponding one of the pair of first surfaces S1. At least one of the via conductors 240B is located at an edge of a corresponding one of the pair of first surfaces S1. At least another one of the via conductors 240B is located at another edge opposite along the third direction D3 (FIG. 11).

As shown in FIG. 10, one end of the first wire 254 is bonded to one (opposite to the mounting substrate 226) of the pair of first surfaces S1. The one end of the first wire 254 is bonded to a corresponding one of the pair of first metal films M1. The one end of the first wire 254 is bonded at a position adjacent to or overlapping with the connection conductor 240. The position where the one end of the first wire 254 is bonded is at an edge, of a corresponding one of the pair of first surfaces S1, adjacent to one of the pair of third surfaces S3.

The one end of the first wire 254 is positioned outer than the via conductor 240B along the third direction D3 (FIG. 11). All of the first wires 254 are bonded to the connection conductor 240 without overlap.

The embodiments described above are not limited and different variations are possible. The structures explained in the embodiments may be replaced with substantially the same structures and other structures that can achieve the same effect or the same objective.

What is claimed is:

1. An optical module comprising:
a stem from which a pedestal portion integrally protrudes;
a photoelectric device configured to convert an optical signal and an electrical signal from at least one to another;
a mounting substrate on which the photoelectric device is mounted;
a support block with a ceramic body, the support block having a metallization pattern on a surface of the ceramic body, the mounting substrate overlapping with the metallization pattern and being mounted on the support block; and
a first wire electrically connecting the pedestal portion and the metallization pattern,
wherein the surface of the ceramic body includes a pair of first surfaces facing in opposite directions along a first direction, the surface of the ceramic body including a pair of second surfaces facing in opposite directions along a second direction intersecting with the first direction, the surface of the ceramic body including a pair of third surfaces facing in opposite directions along a third direction intersecting with both the first direction and the second direction,
wherein the metallization pattern includes a pair of first metal films on the respective pair of first surfaces, the metallization pattern including a second metal film on at least one of the pair of second surfaces to connect the pair of first metal films,
wherein the support block includes at least one connection conductor connecting the pair of first metal films, the at least one connection conductor being at least one of a castellation conductor and a via conductor, the castellation conductor being on at least one of the pair of third surfaces of the ceramic body, and the via conductor being through the ceramic body between the pair of first surfaces,
wherein the pair of third surfaces includes a region not covered with the metallization pattern,
wherein the mounting substrate is mounted on one of the pair of first surfaces, and
wherein one end of the first wire is bonded to a corresponding one of the pair of first metal films or the at least one connection conductor, at a position adjacent to or overlapping with the at least one connection conductor, on another of the pair of first surfaces.

2. The optical module according to claim 1,
wherein the position at which the one end of the first wire is bonded is at an edge of a corresponding one of the pair of first surfaces, the edge being adjacent to one of the pair of third surfaces.

3. The optical module according to claim 2,
wherein the support block has the via conductor, and
wherein the via conductor is at the edge of the corresponding one of the pair of first surfaces.

4. The optical module according to claim 3,
wherein the one end of the first wire is positioned outer than the via conductor along the third direction.

5. The optical module according to claim 3,
wherein the pair of first metal films overlap with the via conductor.

6. The optical module according to claim 3,
wherein the via conductor includes some via conductors,
wherein at least one of the via conductors is at the edge of the corresponding one of the pair of first surfaces, and
wherein at least another one of the via conductors is at another edge opposite to the edge along the third direction.

7. The optical module according to claim 1,
wherein the pair of first surfaces and the pair of second surfaces are entirely covered with the metallization pattern.

8. The optical module according to claim 1,
wherein the one end of the first wire overlaps with the at least one connection conductor.

9. The optical module according to claim 1,
wherein the first wire includes some first wires,
wherein at least one of the first wires is bonded to and overlaps with the at least one connection conductor, and
wherein at least another one of the first wires is bonded to the at least one connection conductor without overlap.

10. The optical module according to claim 1,
wherein the first wire includes some first wires, and
wherein all of the first wires are bonded to the at least one connection conductor without overlap.

11. The optical module according to claim 1,
wherein the support block is disposed to have one of the pair of third surfaces opposed to the pedestal portion.

12. An optical module comprising:
a stem from which a pedestal portion integrally protrudes;
a photoelectric device configured to convert an optical signal and an electrical signal from at least one to another;
a mounting substrate on which the photoelectric device is mounted;
a support block with a ceramic body, the support block having a metallization pattern on a surface of the ceramic body, the mounting substrate overlapping with the metallization pattern and being mounted on the support block;
a first wire electrically connecting the pedestal portion and the metallization pattern;
a thermoelectric cooler containing a Peltier device; and
a second wire electrically connecting the pedestal portion and the metallization pattern,
wherein the surface of the ceramic body includes a pair of first surfaces facing in opposite directions along a first direction, the surface of the ceramic body including a pair of second surfaces facing in opposite directions along a second direction intersecting with the first direction, the surface of the ceramic body including a pair of third surfaces facing in opposite directions along a third direction intersecting with both the first direction and the second direction,
wherein the metallization pattern includes a pair of first metal films on the respective pair of first surfaces, the metallization pattern including a second metal film on at least one of the pair of second surfaces to connect the pair of first metal films,
wherein the support block includes at least one connection conductor connecting the pair of first metal films, the at least one connection conductor being at least one of a castellation conductor and a via conductor, the castellation conductor being on at least one of the pair of third surfaces of the ceramic body, the via conductor being through the ceramic body between the pair of first surfaces,
wherein the mounting substrate is mounted on one of the pair of first surfaces,
wherein one end of the first wire is bonded to a corresponding one of the pair of first metal films or the at least one connection conductor, at a position adjacent to or overlapping with the at least one connection conductor, on another of the pair of first surfaces,
wherein the second metal film includes a pair of second metal films on both of the pair of second surfaces,
wherein the thermoelectric cooler is fixed to one of the pair of second metal films, and
wherein one end of the second wire is bonded to another of the pair of second metal films.

* * * * *